United States Patent [19]

Ozawa

[11] Patent Number: 5,774,199
[45] Date of Patent: Jun. 30, 1998

[54] LIQUID CRYSTAL DISPLAY DEVICE

[75] Inventor: Takaaki Ozawa, Suwa, Japan

[73] Assignee: Seiko Epson Corporation, Tokyo, Japan

[21] Appl. No.: 621,834

[22] Filed: Mar. 26, 1996

[30] Foreign Application Priority Data

Mar. 31, 1995 [JP] Japan .................................. 7-100552
Feb. 16, 1996 [JP] Japan .................................. 8-054189

[51] Int. Cl.⁶ ...................... G02F 1/1335; G02F 1/1345
[52] U.S. Cl. ........................... 349/149; 349/67; 349/152
[58] Field of Search ................................ 359/88, 49, 55, 359/54; 349/149, 62, 152, 143, 63

[56] References Cited

U.S. PATENT DOCUMENTS

| | | | |
|---|---|---|---|
| 4,367,467 | 1/1983 | Emile, Jr. | 359/88 |
| 4,772,100 | 9/1988 | Suenaga | 359/88 |
| 4,789,224 | 12/1988 | Bogsty | 359/49 |
| 4,832,455 | 5/1989 | Takeno et al. | 359/88 |
| 4,945,350 | 7/1990 | Kawamura | 359/49 |
| 5,046,826 | 9/1991 | Iwamoto et al. | 349/62 |
| 5,477,423 | 12/1995 | Fredriksz et al. | 349/62 |
| 5,485,291 | 1/1996 | Qiao et al. | 359/49 |
| 5,485,354 | 1/1996 | Ciupke et al. | 349/62 |
| 5,489,999 | 2/1996 | Matsumoto | 359/49 |

FOREIGN PATENT DOCUMENTS

| | | |
|---|---|---|
| 58-72984 | 5/1983 | Japan . |
| 61-49380 | 4/1986 | Japan . |
| 62-181931 | 11/1987 | Japan . |

*Primary Examiner*—William L. Sikes
*Assistant Examiner*—Toan Ton
*Attorney, Agent, or Firm*—Oliff & Berridge, P.L.C.

[57] ABSTRACT

A liquid crystal display device connecting a circuit board to a liquid crystal display panel through at least one elastic conductor is disclosed herein. In addition to the elastic conductor connecting between the circuit board and the liquid crystal display panel, the liquid crystal display device includes a lamp for radiating a light toward the liquid crystal display panel and a light guide plate disposed between the circuit board and the liquid crystal display panel for conducting the light from the lamp toward the display area of the liquid crystal display panel. The light guide plate includes a positioning portion for surrounding and positioning at least three sides of the elastic conductor and has a height equal to or lower than that of the elastic conductor when it is in its compressed state. The lamp is disposed between the elastic conductor and the display area.

16 Claims, 16 Drawing Sheets

PRIOR ART

LIQUID CRYSTAL DISPLAY DEVICE

BACKGROUND OF THE INVENTION

1. Field of the Invention

The present invention relates to a liquid crystal display device which particularly includes an elastic conductor connecting between a circuit board and a liquid crystal display panel.

2. Description of the Prior Art

The background art of the present invention provides a liquid crystal display device shown in FIG. 19, for example.

Such a liquid crystal display device is small sufficient to be usable as a display module in pagers and cameras. The liquid crystal display device comprises a metallic frame 10 in which a liquid crystal display panel 12, a reflector 14 and a circuit board 16 are mounted.

The circuit board 16 includes a lamp 18 which radiates a light from the side edge of the liquid crystal display panel 12. The light is then reflected by the reflector 14 from the backside of the liquid crystal display panel 12 to provide a back light.

The bottom face of the liquid crystal display panel 12 and top face of circuit board 16 respectively include connecting terminals 20 and 22 which are arranged spaced away from one another along one longitudinal side of the respective members. These connecting terminals 20 and 22 are connected to one another through an electrically conductive rubber 24 between the liquid crystal display panel 12 and the circuit board 16.

Since the reflector 14 is disposed on the circuit board 16, the portion of the reflector 14 on which the conductive rubber 24 is placed includes a cut portion 26 formed therein. The cut portion 26 permits the conductive rubber 24 to be in contact with the connecting terminals 20 of the circuit board 16. The cut portion 26 also functions to position the conductive rubber 24 when it is to be assembled into the liquid crystal display device.

Since the conductive rubber 24 only extends along one longitudinal side of the circuit board 16, a cushion material 28 can be disposed adjacent to the position of the conductive rubber 24 on the circuit board 16 give the reflector 14 the same height as the conductive rubber 24 such that a uniform urging force will be provided when the conductive rubber 24 is to be assembled into the liquid crystal display device.

Aside from the conductive rubber 24 positioned by the cut portion 26 in the reflector 14 as described, a conductive rubber positioning portion (not shown) has been provided in a molding used to assemble the liquid crystal display panel or a separate molding used to position the conductive rubber (not shown) has been made.

When the conductive rubber 24 is to be positioned by the cut portion 26 in the reflector 14 in the aforementioned liquid crystal display device, the conductive rubber 24 can be positioned in the horizontal direction, but cannot be guided in the direction of its height. If the conductive rubber 24 is compressed between the liquid crystal display panel 12 and the circuit board 16, the conductive rubber 24 undesirably tends to be flexed such that the conductive rubber 24 cannot be reliably positioned.

If the part of positioning the conductive rubber is formed in a casing in which the liquid crystal display panel is to be set, such a casing must be a commercial mold. If the casing is not the commercial mold, the conductive rubber cannot be positioned in the casing. If it is necessary to make a mold separately to position the conductive rubber, the number of parts will increase. This raises a further problem in that the degree of freedom in the design will be limited by the increased number of parts.

Furthermore, the liquid crystal display device of the prior art uses the lamp 18 on the circuit board 16 to radiate the light from the side edge of the liquid crystal display panel 12. Thus, the conductive rubber 24 cannot be located on the same side as the lamp 18 is mounted, because the conductive rubber 24 will block the light from the lamp 18. Therefore, the conductive rubber 24 must be located anywhere other than the side that the lamp 18 is mounted. This limits the arrangement of the connecting terminals 20 in addition to the limitation relating to the circuit layout.

In the prior art, the conductive rubber 24 was arranged on one longitudinal side of the circuit board 16. Such an arrangement cannot provide a uniform urging force between the circuit board 16 and the liquid crystal display panel 12 only by the conductive rubber 24. Thus, the cushion material 28 had to be located adjacent the conductive rubber 24 to provide the uniform urging force. The number of parts was increased by the cushion material 28.

SUMMARY OF THE INVENTION

It is therefore an object of the present invention to provide a liquid crystal display device which comprises an elastic conductor connecting between a circuit board and a liquid crystal display panel without increase of the number of parts and which can reliably guide the elastic conductor in both the horizontal and compressive directions without limitation of the circuit layout.

Another object of the present invention is to provide a liquid crystal display device which can uniformly compress the elastic conductor between the circuit board and the liquid crystal display panel.

A further object of the present invention is to provide a liquid crystal display device which can effectively utilize the shorter sides of the circuit board and liquid crystal display panel to increase the number of connecting terminals.

Therefore, the present invention provides a liquid crystal display device comprising:

a circuit board having an electrically conductive pattern;

a liquid crystal display panel including a central display area and a plurality of electrode terminals disposed along a plurality of sides and connected to said conductive pattern, said liquid crystal display panel being disposed opposite to said circuit board;

at least one elastic conductor disposed and compressed between said circuit board and said liquid crystal display panel for connecting part of said electrode terminals disposed along at least one side of said plurality of sides in said liquid crystal display panel to said conductive pattern of said circuit board;

a lamp for radiating a light toward said liquid crystal display panel; and a light guide plate disposed between said circuit board and said liquid crystal display panel for conducting the light from said lamp to said central display area of said liquid crystal display panel, said light guide plate having at least one positioning portion for positioning said elastic conductor such that at least three sides of said at least one elastic conductor are surrounded by said positioning portion, said positioning portion having a height equal to or lower than that of said compressed elastic conductor, said lamp being disposed at a position between said elastic conductor and said central display area.

According to the present invention, at least three sides of the elastic conductor are surrounded by the positioning portion of the light guide plate which has its height equal to or lower than the height of the compressed elastic conductor. This enables the elastic conductor to be reliably positioned in the horizontal direction while positively avoiding any unnecessary flexion of the compressed elastic conductor in the transverse direction, without increase of the number of parts and with provision of a reliable contact state.

Since the lamp is disposed between the elastic conductor and the display area, the lamp and elastic conductor can be disposed on the same side. As a result, the connecting terminals can be disposed on the opposite sides of the circuit board to eliminate the limitation relating to the circuit layout, providing a more free circuit layout.

It is preferred that the lamp is mounted in the receiving portion of said light guide plate.

Thus, the lamp can be easily and reliably positioned relative to the light guide plate.

It is also preferred that two positioning portions for positioning two elastic conductors are formed in said light guide plate on its opposite sides.

Thus, the two elastic conductors can be uniformly compressed by the circuit board and the liquid crystal display panel.

It is further preferred that said light guide plate includes a thin-walled portion formed at an area opposite to the central display area of said liquid crystal display panel and two thick-walled portions extending toward the circuit board and formed at a position incorporating the two positioning portions and having its thickness larger than that of said thin-walled portion.

Thus, the two thick-walled portions formed on the two positioning portions of the elastic conductor to extend toward the circuit board form a space on the bottom of the light guide plate, which space can be used to receive the other parts.

It is further preferred that one of the two thick-walled portions is formed with a recess for receiving the lamp.

Thus, the recess which is formed in the thick-walled portion on the side of the light guide plate and in which the lamp is embedded facilitates the mounting of the lamp in the light guide plate.

The recess has an opening faced to the liquid crystal display panel and a bottom opposite to said opening. A terminal insertion aperture for receiving the terminals of the lamp is preferably formed through the bottom of the recess.

Thus, the lamp can be inserted into the light guide plate through the opening of the recess, with the terminals thereof being located to extend through the terminal insertion aperture of the recess. The mounting of the lamp on the light guide plate can be easily and reliably made while ensuring the positioning of the lamp terminals relative to the circuit board through the terminal insertion aperture.

It is further preferred that a first reflector for reflecting the light from the lamp is further provided between the circuit board and the light guide plate and that a supporting portion for supporting the first reflector is formed on the surface of said light guide plate opposite to said circuit board.

Thus, the light guide plate can also be used to support the first reflector for increasing the efficiency of light utilization. The supporting portion may be formed in the thick-walled portion.

It is further preferred that a second reflector for reflecting the light from the lamp is further provided at least between the lamp and said at least one elastic conductor.

The second reflector can avoid any leakage of light from the lamp and improve the lightness in the back light.

The second reflector may be in the form of a material layer applied to the side of said at least one elastic conductor opposite to said lamp or a reflecting sheet applied to the side of said at least one elastic conductor opposite to said lamp.

When the reflector is disposed on one side of the elastic conductor, the reflector can be provided only by disposing the elastic conductor on the positioning portion, thereby reducing time and/or labor required to mount the reflector.

It is further preferred that said liquid crystal display panel includes a plurality of scan electrode terminals disposed on said liquid crystal display panel along first and second opposing sides thereof and a plurality of signal electrode terminals disposed said liquid crystal display panel along a third side between the first and second sides and that said plurality of scan electrode terminals disposed on the liquid crystal display panel along the first and second sides thereof are connected to the conductive pattern on said circuit board through the two elastic conductors.

In such an arrangement, thus, a sufficient number of electrode terminals can be ensured. In addition, the elastic conductors can be uniformly compressed by providing them on the opposite sides.

In this case, it is preferred that a flexible circuit board is provided which connects said plurality of signal electrode terminals in said liquid crystal display panel to the conductive pattern of said circuit board.

When a relatively small number of scan electrode terminals are connected to one another through the elastic conductors and an increased number of signal electrode terminals are connected to one another through the flexible circuit board, thus, the more reliable connection between the terminals can be provided.

It is further preferred that the flexible circuit board simultaneously supplies the same signal to two of said signal electrode terminals which are disposed at positions axisymmetrical with each other about a center line bisecting said plurality of signal electrode terminals.

Thus, the driver may have its capacity sufficient to drive one-half the signal electrode terminals now used therein. This can provide a more inexpensive driver.

In a further form, the present invention provides a liquid crystal display device comprising:

a circuit-board having an electrically conductive pattern;

a substantially rectangular liquid crystal display panel having a pair of shorter sides and a pair of longer sides, said liquid crystal display panel including a plurality of electrode terminals disposed along said pair of shorter sides and connected to said electrically conductive pattern and a central display area, said liquid crystal display panel being disposed opposite to said circuit board;

two elastic conductors disposed and compressed between said circuit-board and said liquid crystal display panel for connecting said plurality of electrode terminals disposed along at least two sides of said liquid crystal display panel to said electrically conductive pattern of said circuit-board;

a lamp for radiating a light toward said liquid crystal display panel; and a light guide plate disposed between said circuit board and said liquid crystal display panel for conducting the light from said lamp toward said liquid crystal display panel, said lamp being disposed between at least one of said elastic conductors and said display area.

In such an arrangement, the connecting terminals can be connected to one another through the elastic conductors on the shorter sides of the light guide plate while at the same time securing the radiation of the lamp toward the display area. As a result, the connecting terminals can be disposed on the opposite ends of the shorter sides of the circuit board. This can eliminate the limitation relative to the circuit layout, thereby providing a more free circuit layout.

DETAILED DESCRIPTION OF THE PREFERRED EMBODIMENTS

Some preferred embodiments of the present invention will now be described with reference to the drawings.

FIGS. 1 to 13 show one embodiment of a liquid crystal display device constructed in accordance with the present invention.

Figure 4:
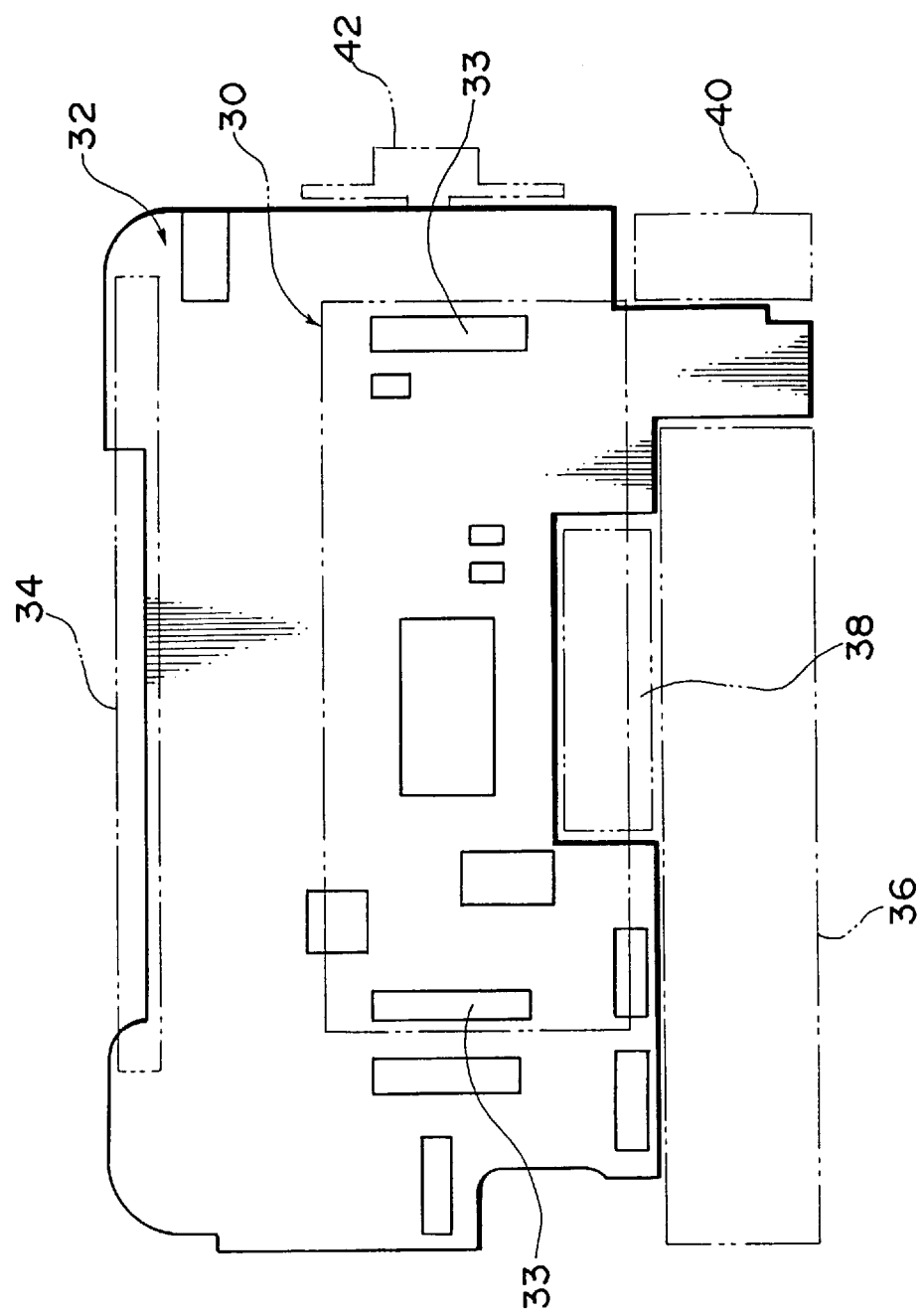
FIG. 4 is a plan view showing a mother board on which the liquid crystal display device of FIGS. 1 and 2 is mounted.
Figure 5:
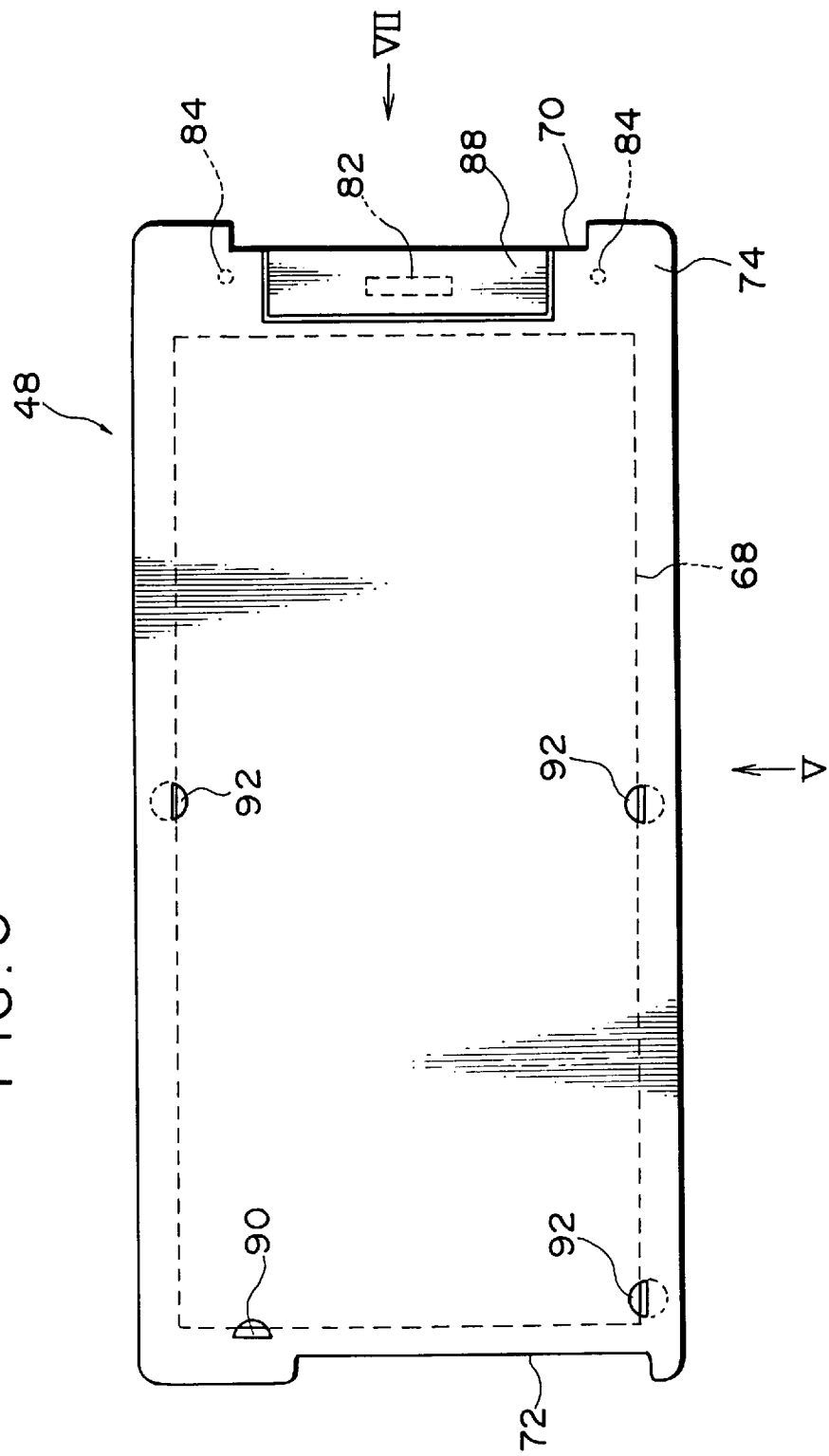
FIG. 5 is a front view of the light guide plate shown in FIGS. 1 and 2.

The liquid crystal display device 30 is used as a display module in a pager and adapted to be mounted on a mother board 32 in the pager body through female connectors 33, as shown in FIG. 4.

The pager body includes an antenna 34, a battery 36, a vibrator 38, a buzzer 40, a slide switch 42 and so on.

Figure 1:
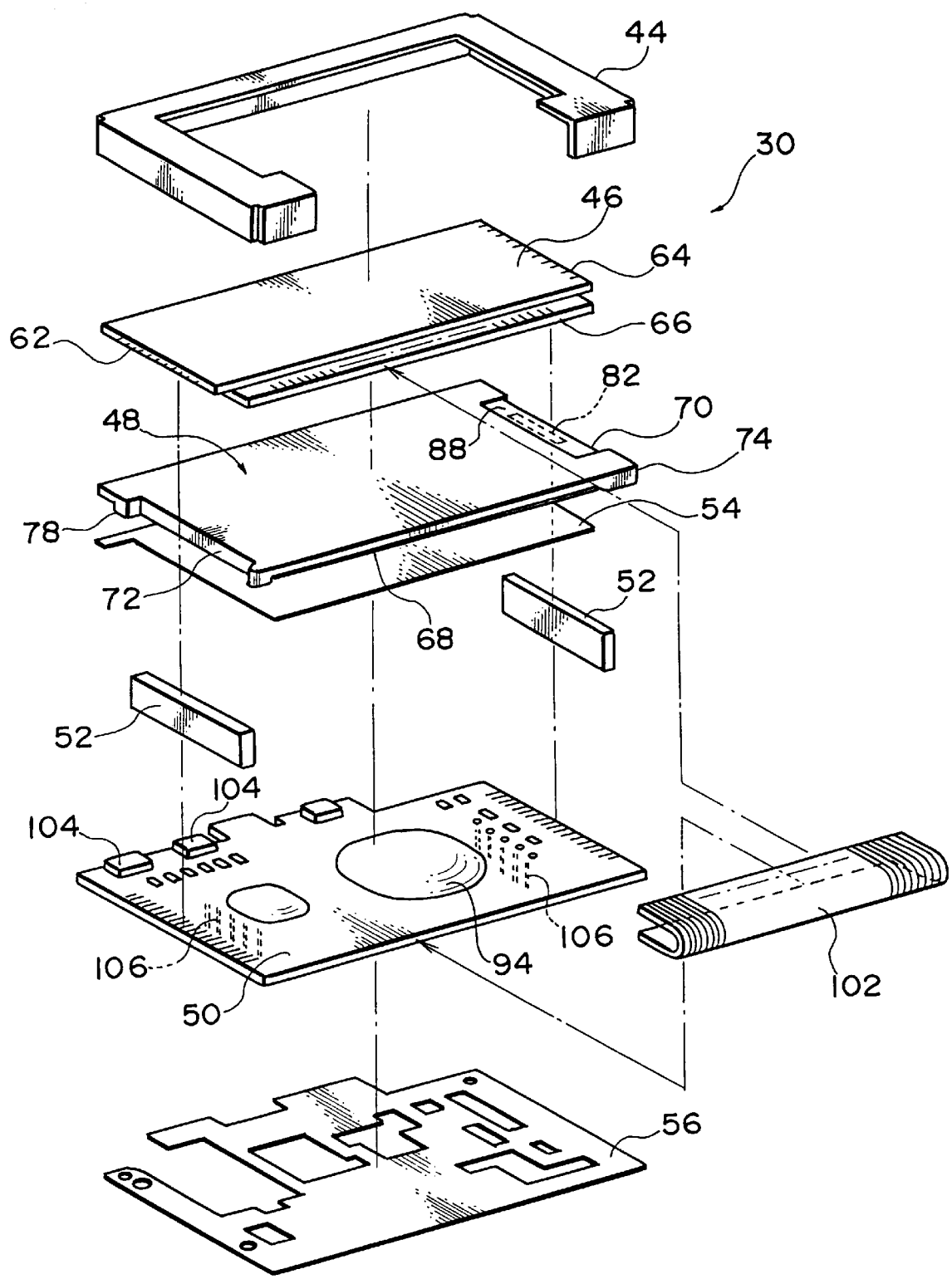
FIG. 1 is an exploded perspective view of one embodiment of a liquid crystal display device constructed in accordance with the present invention.

As shown in FIG. 1, the liquid crystal display device 30 comprises a substantially inverted C-shaped metallic frame 44 into which a liquid crystal display panel 46, a light guide plate 48, a circuit board 50, elastic conductors 52, first and second shield plates 54, 56 and other components are incorporated.

Figure 10:
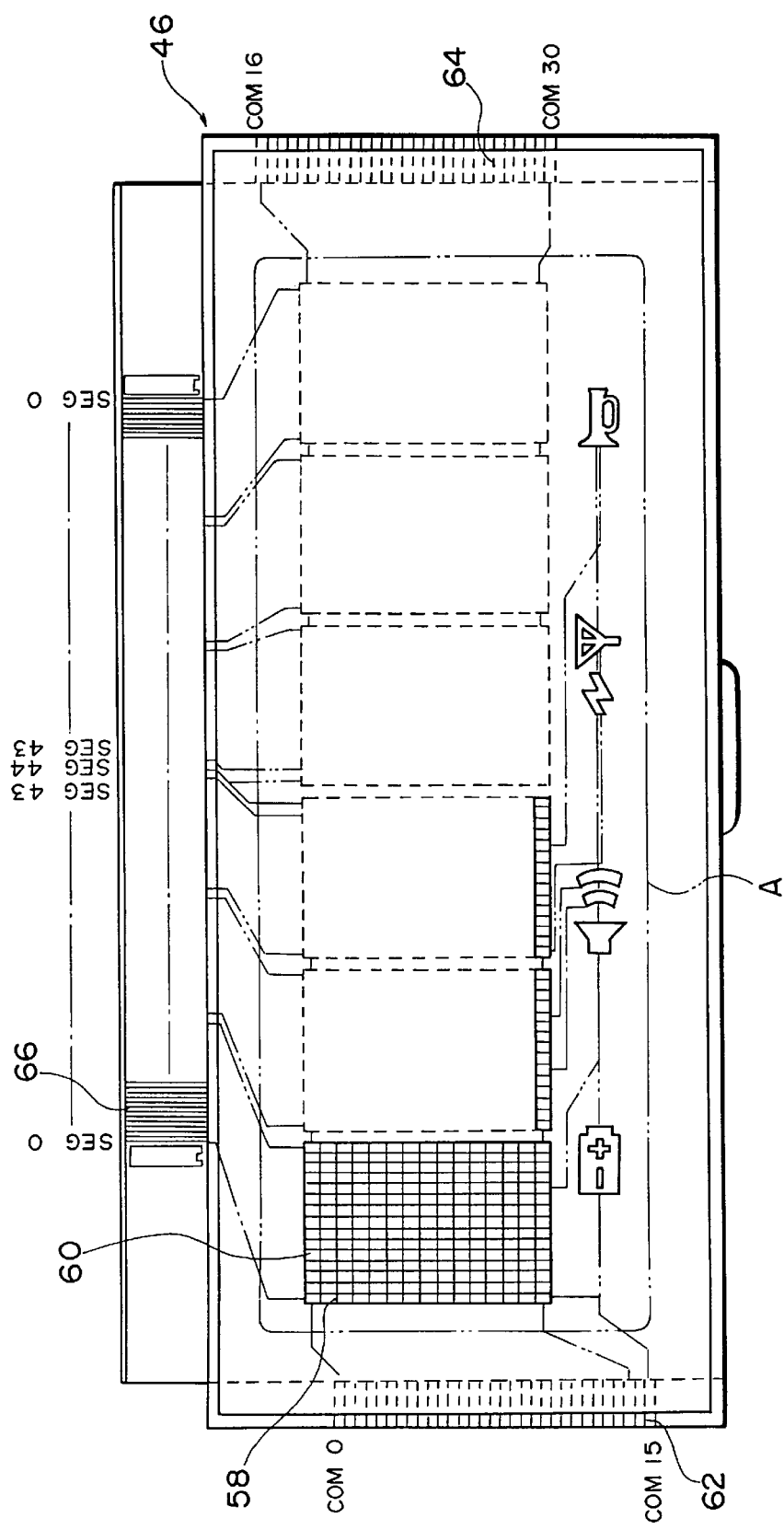
FIG. 10 is a front view of the liquid crystal display device shown in FIGS. 1 and 2.

As shown in FIG. 10, the liquid crystal display panel 46 comprises a plurality of scan electrodes 58 and a plurality of signal electrodes 60, which are disposed into a matrix in a display area A. The terminals 62 and 64 of the scan electrodes 58 are arranged along the opposite sides of the liquid crystal display panel 46 (a pair of shorter sides) while the terminals 66 of the signal electrodes 60 are arranged along one of the remaining sides of the liquid crystal display panel 46 (one longer side).

Figure 2:
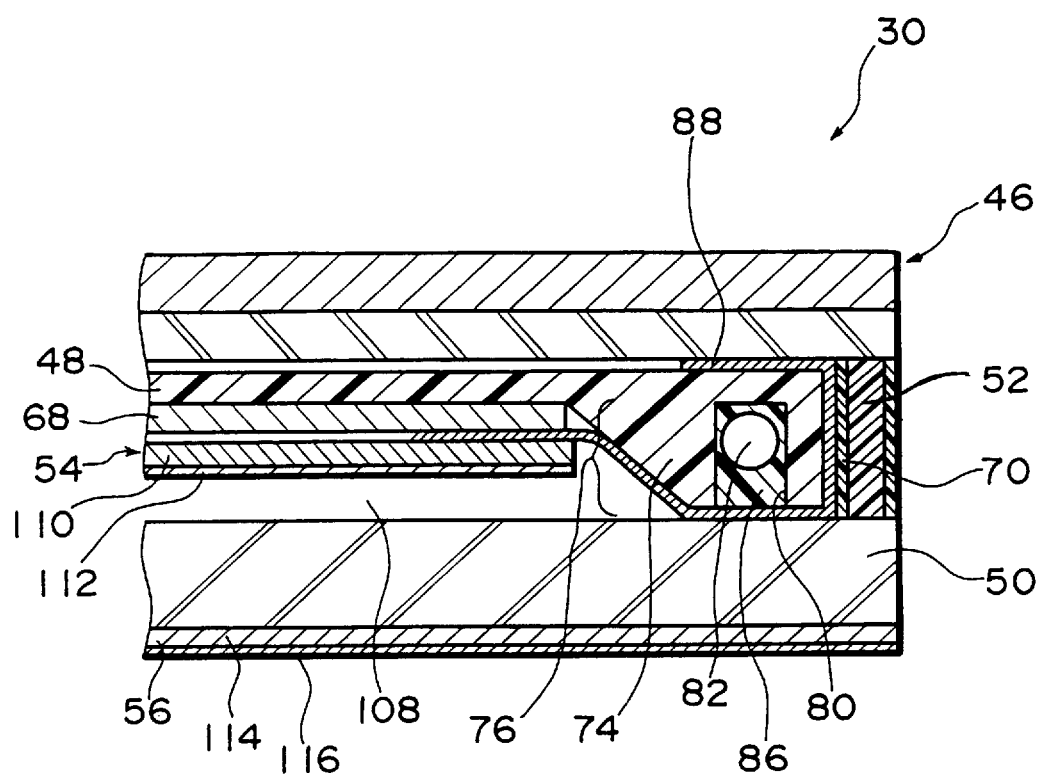
FIG. 2 is a sectional view showing a lamp that is embedded in place in the parts assembly of FIG. 1.
Figure 6:
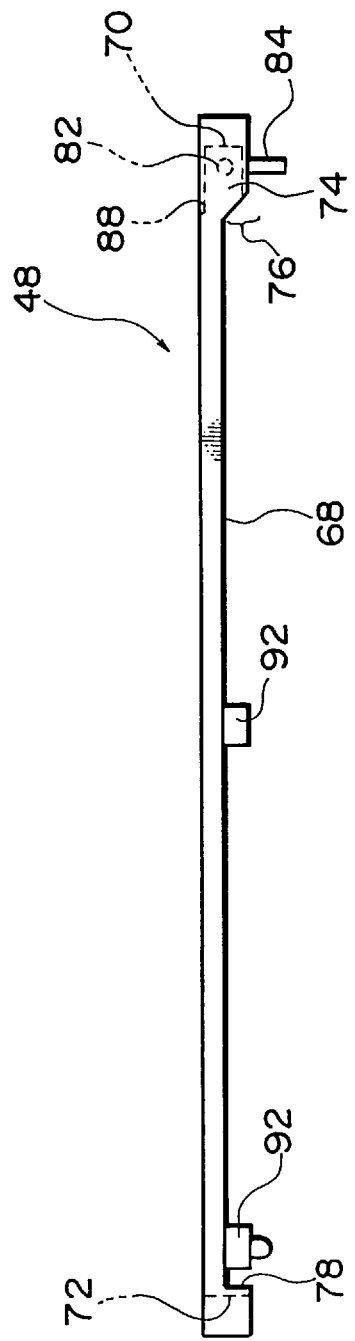
FIG. 6 is a side view as viewed from the direction of arrow V in FIG. 5.
Figure 7:
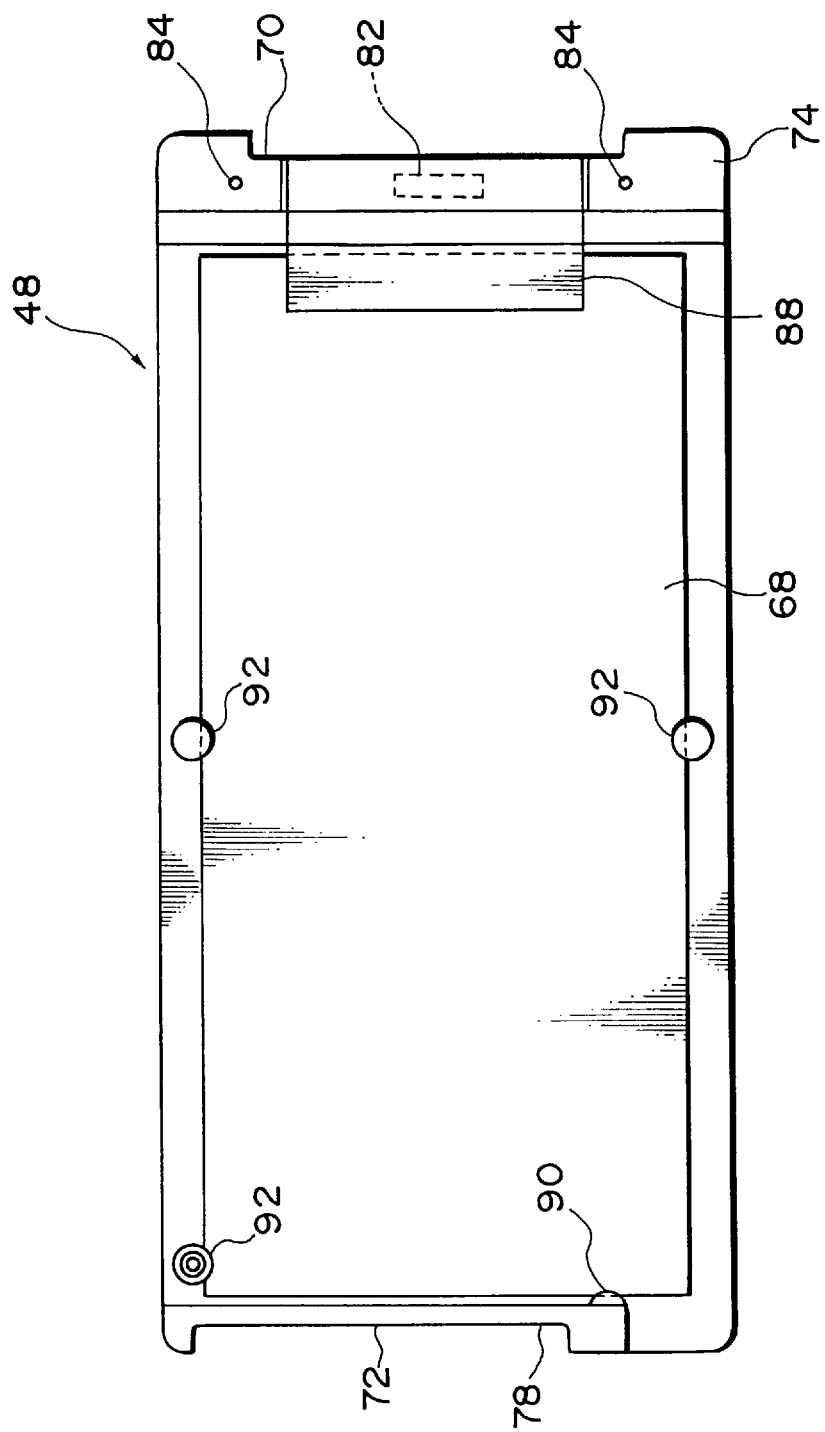
FIG. 7 is a back view of the light guide plate of FIG. 5.
Figure 8:
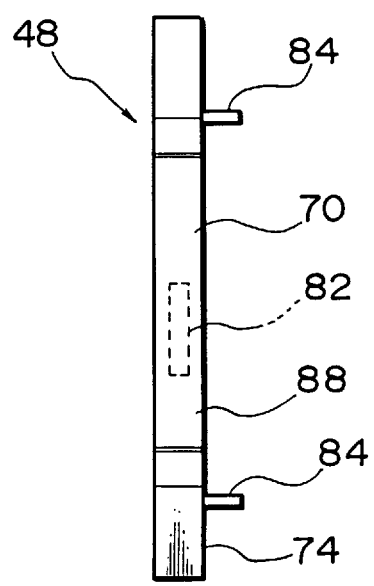
FIG. 8 is a side view as viewed from the direction of arrow VII in FIG. 5.
Figure 9:
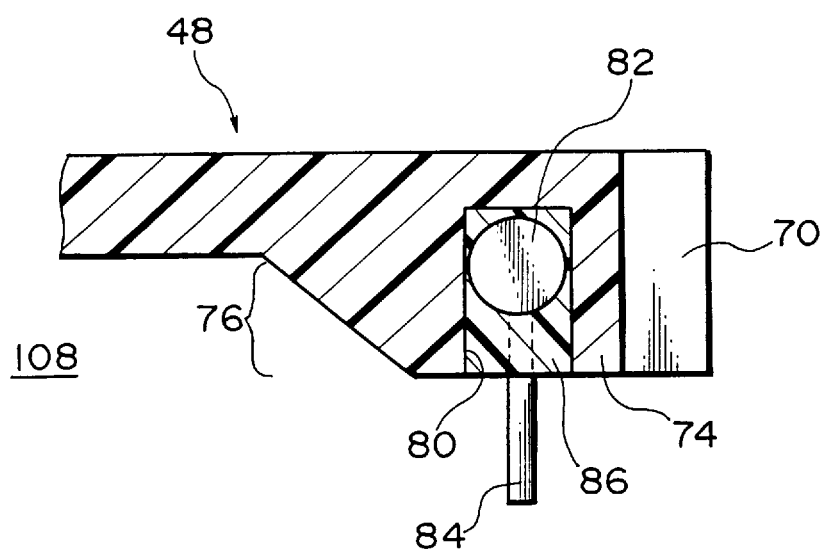
FIG. 9 is a sectional view showing the lamp receiving portion of FIG. 8.

The light guide plate 48 is adapted to conduct a light from a lamp toward the central display area A of the liquid crystal display panel 46 (see FIG. 10) and includes a bottom face (underside as viewed in FIG. 1) which is wholly formed into a fresnel mirror or the like for diffusing the light radiated from the lamp toward the edge of the liquid crystal display panel to uniformly conduct it onto the overall display area A. As shown in FIGS. 1, 2 and 6, the bottom face of the light guide plate 48 also includes a reflecting sheet 68 mounted thereon.

The light guide plate 48 further includes, at each end, a positioning portion 70 or 72 for positioning the corresponding one of the elastic conductors 52.

Each of the positioning portions 70 or 72 is shaped to surround the corresponding elastic conductor 52 about its three sides and to have a height equal to or lower than that of the elastic conductor 52 when it is in its compressed state.

More particularly, as shown in FIGS. 2 and 5–9, one positioning portion 70 is defined by a thick-walled portion 74 that is formed in the light guide plate 48 on one end to have a height equal to or lower than that of the compressed elastic conductor 52. A part of the side of the thick-walled portion 74 is cut so as to match the length and thickness of the elastic conductor 52.

The thick-walled portion 74 extends toward the side of the circuit board 50. Thus, the positioning portion 70 will also include a protrusion 76 extending toward the circuit board.

The other positioning portion 72 is also formed by cutting a part of the other end of the light guide plate 48 to match the length and thickness of the corresponding elastic conductor 52. This positioning portion 72 also includes a protrusion 78 that is formed to extend toward the circuit board 50 along the bottom edge of the cut portion for providing a similar thick-walled portion. As a result, the positioning portion 72 will also be formed to match the length and thickness of the corresponding elastic conductor 52.

The light guide plate 48 also includes a thin-walled portion formed therein to be located opposite to the display area A and between the two thick-walled positioning portions 70 and 72.

The thick-walled portion 74 of the light guide plate 48 includes a recess 80 formed therein at its bottom. The recess 80 receives a lamp 82.

The recess 80 has its longitudinally extending sides parallel to the positioning portion 70. The recess 80 is located between the positioning portion 70 and the display area A. The lamp 82 received in the recess 80 has its terminal 84 extending in the downward direction and is embedded in the recess 80 by filling it with an adhesive 86.

Figure 3:
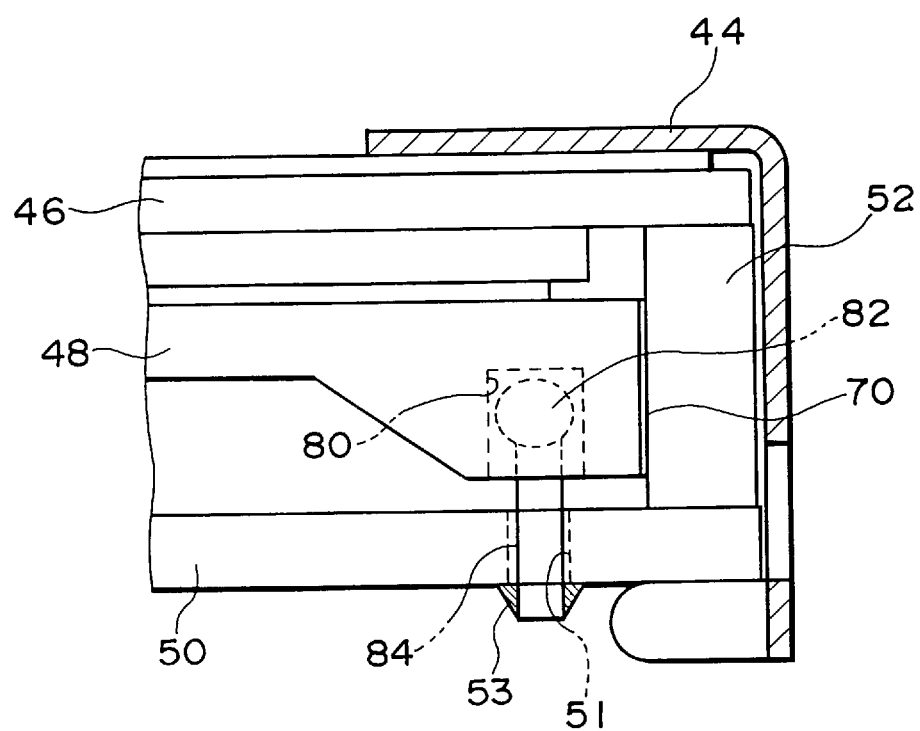
FIG. 3 is a sectional view showing the connection of the lamp in the parts assembly of FIG. 1.

As shown in FIG. 3, the terminal 84 of the lamp 82 externally extends through a through-hole 51 in the circuit board 50, the outer end of the terminal 84 outside the circuit board 50 being soldered at 53 to the circuit board 50.

The thick-walled portion 74 supporting the lamp 82 is covered with a reflecting sheet 88 to avoid any external leakage of the light from the lamp 82 for improving the efficiency of illumination. The reflecting sheet 88 extends from the top face of the thick-walled portion 74 through the bottom face of the positioning portion 70 to the bottom face of the light guide plate 48 and is adhered to these faces to hold the end of the reflecting sheet 68 that has been applied to the bottom face of the light guide plate 48.

The protrusion 78 of the positioning portion 72 includes a supporting portion 90 for receiving the end of the reflecting sheet 68. Thus, the supporting portion 90 co-operates with the other reflecting sheet 88 to hold the reflecting sheet 68. Several supporting members 92 for holding the reflecting sheet 68 are also integrally formed in the bottom of the light guide plate 48.

Figure 11:
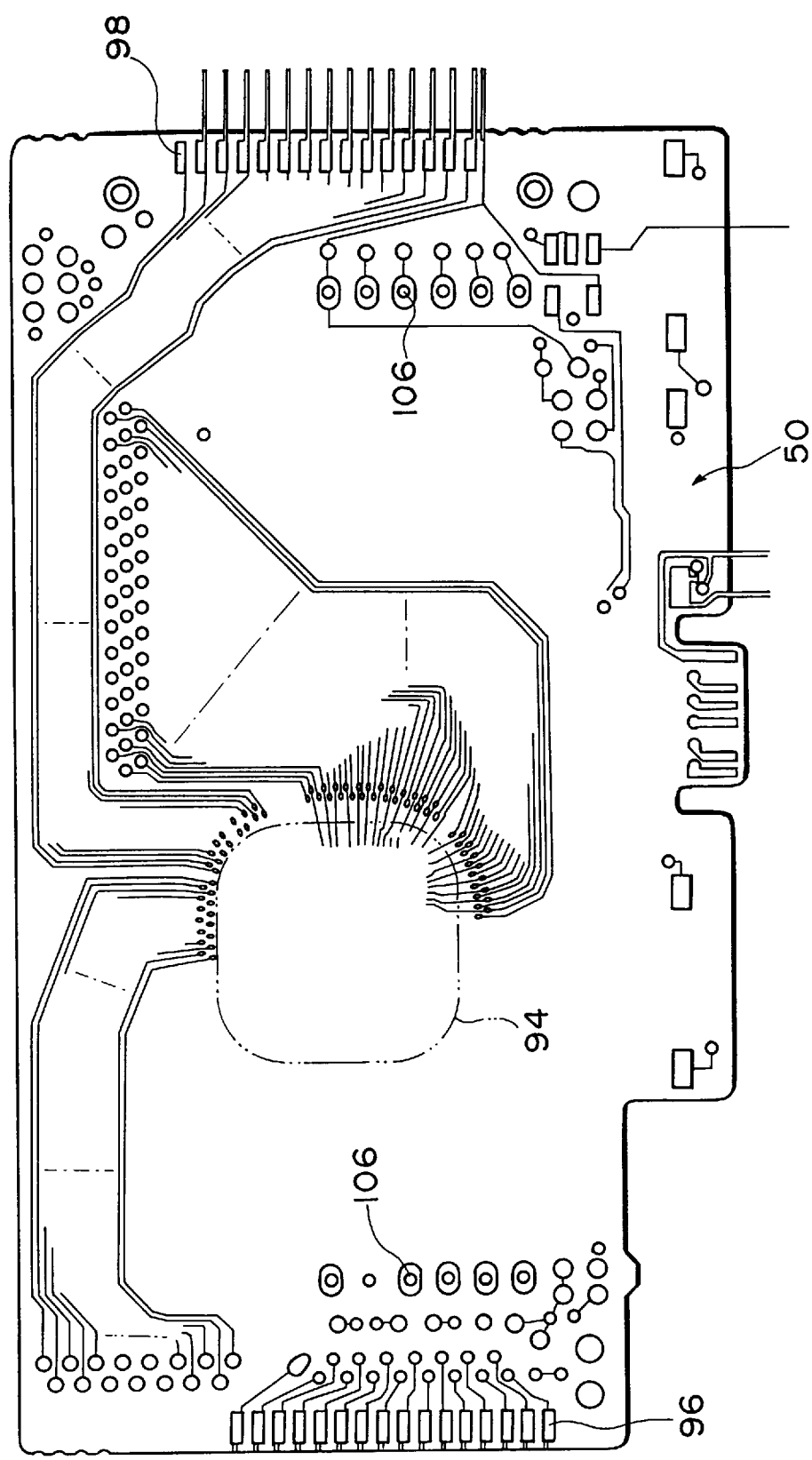
FIG. 11 is a front view of the circuit board shown in FIGS. 1 and 2.
Figure 12:
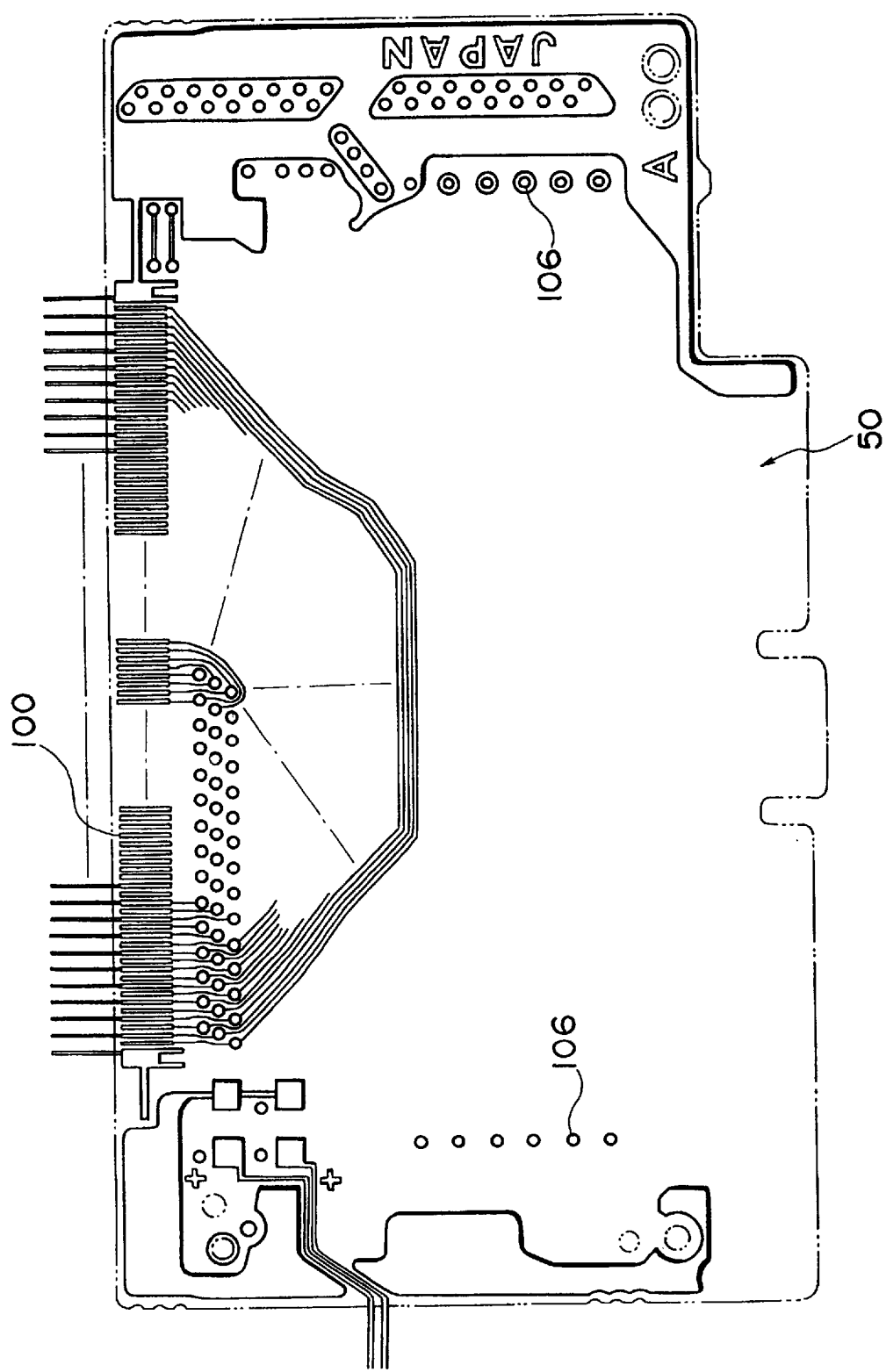
FIG. 12 is a back view of the circuit board shown in FIG. 11.

As shown in FIGS. 1, 11 and 12, the circuit board 50 includes an electrode driver 94 mounted on the top thereof. The electrode driver 94 is connected to drive side scan electrode terminals 96 and 98 that are disposed on the top and bottom faces of the circuit board 50 and also to drive side signal electrode terminals 100 that are arranged on the bottom of the circuit board 50 along its one longitudinal side. The drive side signal electrode terminals 100 are respectively connected to the signal electrode terminals 66 on the liquid crystal display panel 46 through a flexible circuit board such as a film carrier tape 102.

A plurality of mounted parts 104 are mounted on both the top and bottom of the circuit board 50. The bottom of the circuit board 50 also includes insertion terminals 106 inserted into the female connectors 33 of the mother board 32 and so on.

Each of the elastic conductors 52 is used to connect between the scan electrode terminals 96 or 98 of the circuit board 50 and the scan electrode terminals 62 or 64 of the liquid crystal display panel 46. These elastic conductors 52 are disposed on the circuit board 50 at its opposite ends between the liquid crystal display panel 46 and the circuit board 50 such that the elastic conductors 52 are compressed between the liquid crystal display panel 46 and the circuit board 50 while maintaining their conducting state.

In such a case, the elastic conductors 52 are horizontally positioned by the positioning portions 70 and 72 on the opposite ends of the light guide plate 48 while reliably avoiding any unnecessary transverse flexion in the compressed elastic conductors 52, since the positioning portions 70 and 72 are formed to have their height equal to or lower than that of the compressed elastic conductors 52, as described.

The flex deformation of the elastic conductors 52 to the outward direction can be prevented by the inner walls of the metallic frame 44.

The elastic conductors 52 may be formed of any electrically conductive rubber material such as silicone rubber, zebra connector, zebra rubber or the like. In this embodiment, the elastic conductors 52 are preferably formed of the silicone rubber.

Alternatively, the elastic conductors 52 may be formed of an anisotropic conductive sheet in which conductive carbon fibers having their diameter between about 3 microns and 20 microns are oriented with high density within an insulation silicone rubber in its thickness direction or another anisotropic conductive sheet in which metal fibers having their diameter between 20 microns and 30 microns are oriented with high density within an insulation silicone rubber in its thickness direction or a flexible printed circuit board (FPC) plated as a connector member and including a core material of insulation silicone sponge rubber.

When the elastic conductors 52 are disposed between the liquid crystal display panel 46 and the circuit board 50 at their opposite ends, the elastic conductors 52 can be uniformly compressed without need of any cushion material as in the prior art. This can reduce the number of parts.

Even if the elastic conductors 52 are disposed between the liquid crystal display panel 46 and the circuit board 50 at their opposite ends, the light from the lamp 82 will not be blocked by the elastic conductors 52 since the lamp 82 is located adjacent the display area of the light guide plate 48 rather than the elastic conductors 52. Thus, the elastic conductors 52 can be arranged on the same side as the lamp 82 is located. This eliminates the limitation relative to the circuit layout and provides a more free circuit layout.

Since the elastic conductors 52 can be disposed on the circuit board 50 at its opposite ends, the number of scan electrode terminals 96 on the circuit board 50 can be increased. As shown in FIG. 10, for example, the liquid crystal display panel 46 may include one group of scan electrode terminals 62 set at COM0–COM15 and the other group of scan electrode terminals 64 set at COM16–COM30, thereby dividing the display area into two controllable sub-areas.

In such a case, the signal electrode terminals 66 on the liquid crystal display panel 46 may be formed into two axisymmetrically divided groups designated SEG0–SEG44, as shown in FIG. 10. If any pair of signal electrode terminals 66 axisymmetrically located on the liquid crystal display panel 46 simultaneously receive the same signal, the capacity of the driver may be reduced one-half to control all the signal electrode terminals 66 even if the number of signal electrode terminals 66 further increases. This enables a more inexpensive driver to control all the electrode terminals in the liquid crystal display device.

For example, the same signal may be simultaneously supplied to two electrode terminals SEG0 and SEG0 on the opposite ends of the signal electrode terminal group 66. A scan signal may be fed to any one of the scan electrode terminal group 62 (e.g., any one of COM0–COM15) while no signal is supplied to the other scan electrode terminal group 64. After a display has been made relating to any one of COM0–COM15, a scan signal is supplied to any one of COM16–COM30. Thus, the display can be made in the two divided display sections through a drive of relatively low capacity.

The first shield plate 54 is located between the light guide plate 48 and the circuit board 50 to prevent any noise from the circuit board 50 from influencing the receiver section in the mother board 32.

In such a case, the first shield plate 54 is applied to the bottom of the light guide plate 48 utilizing a space 108 that is formed between the bottom of the light guide plate 48 and the circuit board 50 by the protrusions 76 and 78 in the positioning portions 70 and 72. The first shield plate 54 may be formed of a flexible printed circuit board (FPC) which comprises an insulation base layer 110 of insulation material such as polyimide polyester or the like and a shield layer 112 formed over the whole insulation layer 110 and of an electrically conductive material such as copper or the like. Such an electrically conductive material may be any other material such as iron, aluminum, silver or the like.

Figure 13:
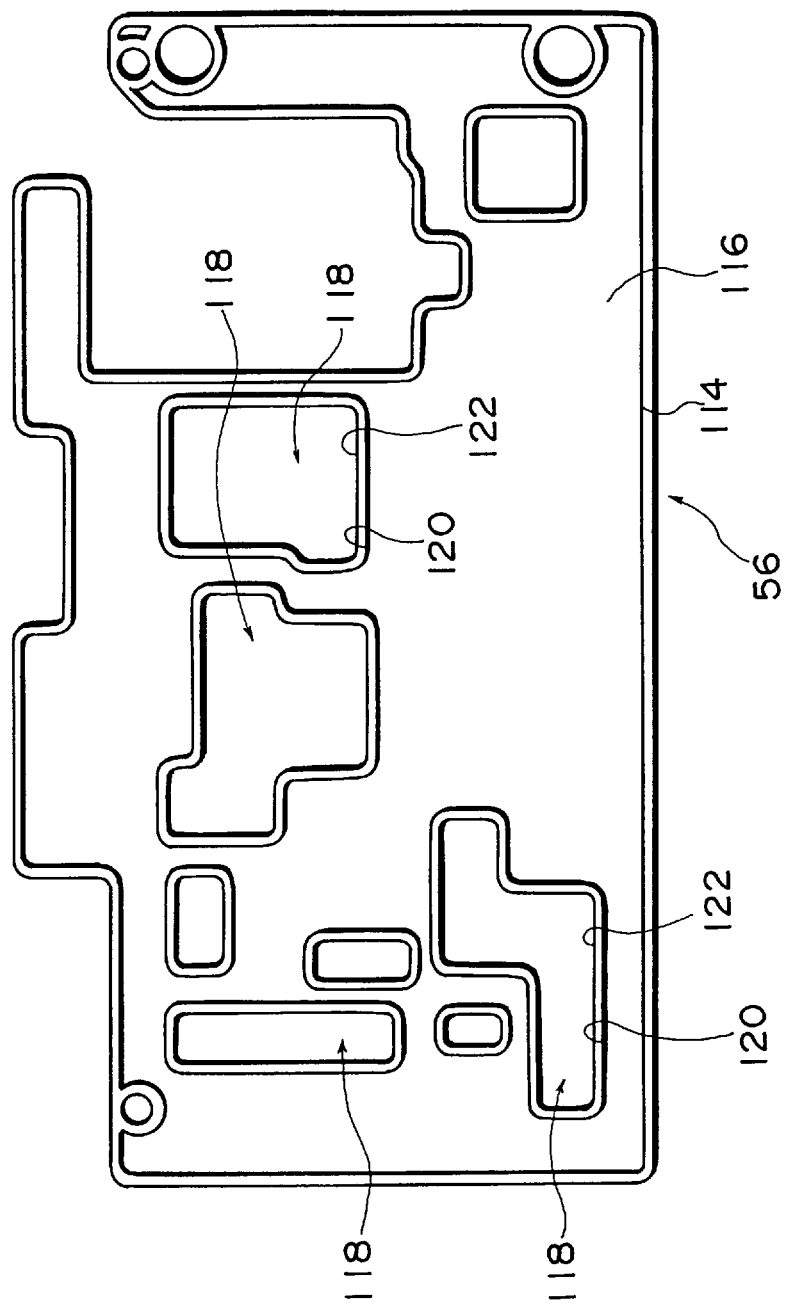
FIG. 13 is a front view of the shield plate shown in FIGS. 1 and 2.

As shown in FIG. 13, the second shield plate 56 is similarly formed of a flexible printed circuit board (FPC) which comprises an insulation base layer 114 of insulation material and a shield layer 116 of electrically conductive material formed over the whole insulation layer 114. The second shield plate 56 includes insertion holes 118 formed therethrough to receive electric components such as the electronic parts on the bottom of the circuit board 50, the insertion terminals 106 to the female connectors 33 of the mother board 32 and so on. The second shield plate 56 is mounted on the bottom of the circuit board 50.

Each of the insertion hole 118 of the second shield plate 56 includes a first insertion hole section 120 which is formed through the shield layer 116 and finished by etching the punched portions therein and a second insertion hole section 122 which is punched through the insulation layer 114 within the portion of the first insertion hole 120 having no shield layer 116 at a portion of the shield layer 116 remote from the edge of the first insertion hole 120.

With provision of the first and second insertion holes 120, 122 in such a manner, the first insertion hole 120 will be larger than the second insertion hole 122. When the electronic parts and insertion terminals 106 are inserted through the insertion holes 118, these parts may contact the edge of the second insertion holes 122, but not contact the first insertion holes 120 larger than the second insertion holes 122. As a result, any short-circuiting between the conductive shield layer 116 and the terminals of the electronic parts can be reliably avoided. This means that the assembly can be more easily made without need of any accurate position in the second shield plate 56.

Figure 14:
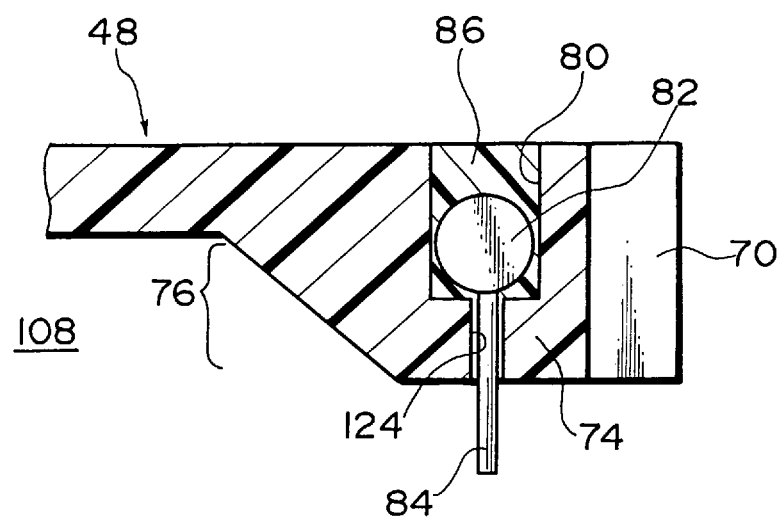
FIG. 14 is a sectional view showing the lamp receiving portion in a light guide plate according to another embodiment of the present invention.

FIG. 14 shows another embodiment of the present invention.

This embodiment includes a recess 80 opened to the top of a thick-walled portion 74 in a light guide plate 48 at one end. The recess 80 includes a terminal insertion hole 124 formed therethrough for receiving a terminal 84 of a lamp 82 which is received within the recess 80. Thus, the lamp 82 can be more easily and reliably positioned within the recess 80. The recess 80 is finally filled with an adhesive 86 to embed the lamp 82 therein.

Figure 15:
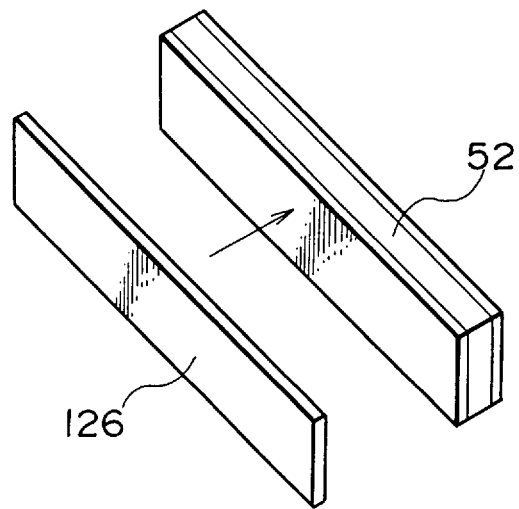
FIG. 15 is a perspective view showing a reflecting sheet according to a further embodiment of the present invention.

FIG. 15 shows a further embodiment of the present invention.

This embodiment includes a reflecting sheet 126 mounted on an elastic conductor 52 at one side. Merely by disposing the elastic conductor 52 in the corresponding positioning portion 70, the reflecting sheet 126 can be simultaneously located within the liquid crystal display device. This reduces time and labor required to mount the reflecting sheet.

In the embodiment of FIGS. 1 to 13, the reflecting sheet 68 is disposed on the bottom of the light guide plate 48 and supported by the supporting portions 90 and 92. On the other hand, the reflecting sheet 88 is adhered to the end of the light guide plate 48 in which the lamp 82 is embedded and extended into the corresponding positioning portion 70. On the contrary, the embodiment of FIG. 15 is defined such that the elastic conductor 52 has been previously received in the positioning portion 70. If the elastic conductor 52 includes the reflecting sheet 126 adhered to the one side thereof, therefore, the reflecting sheet 126 will be more easily disposed within the positioning portion 70.

Figure 16:
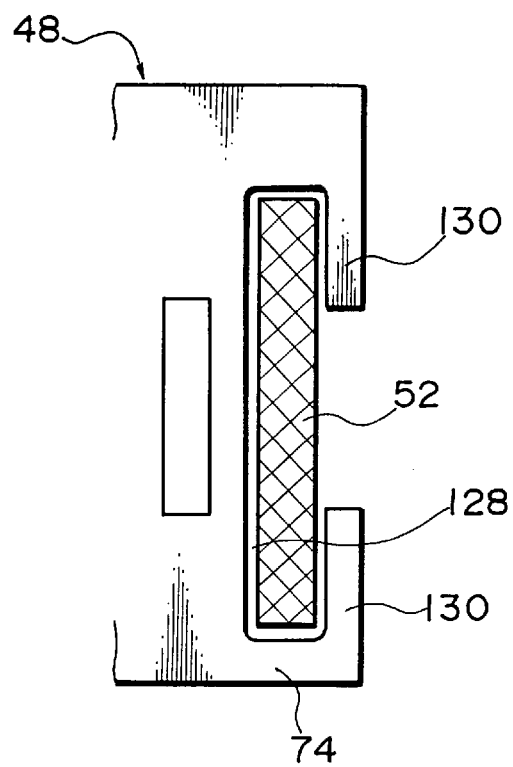
FIG. 16 is a plan view showing a positioning portion in an elastic conductor according to a further embodiment of the present invention.

FIG. 16 shows a further embodiment of the present invention.

This embodiment includes a substantially C-shaped positioning portion 128 formed in a light guide plate 48 at one end. The positioning portion 128 provides a pair of supporting portions 130 for supporting an elastic conductor 52 adjacent its outer ends. Thus, any unnecessary transverse flex deformation in the compressed elastic conductor 52 can be substantially prevented simply by the light guide plate 48. At the same time, the elastic conductor 52 can be more easily incorporated into the liquid crystal display device simply by temporal supporting of the elastic conductor 52.

Figure 17:
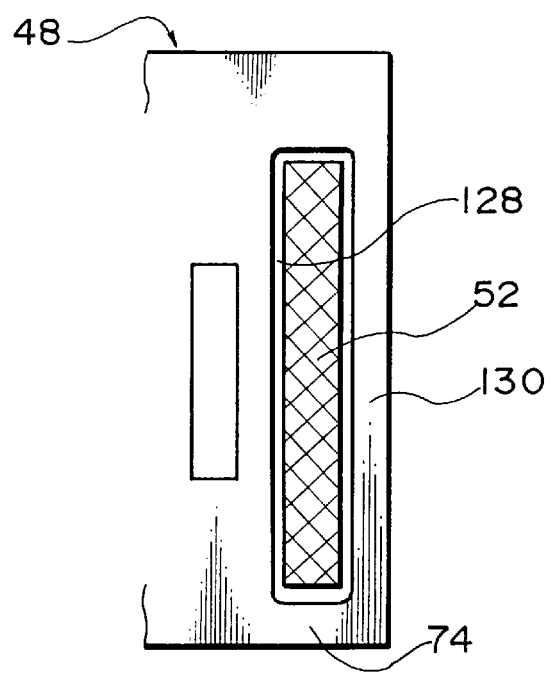
FIG. 17 is a plan view showing a positioning portion in an elastic conductor according to a further embodiment of the present invention.

FIG. 17 shows a further embodiment of the present invention.

This embodiment includes a continuous supporting portion 130 and slot-shaped positioning portion 128. Such a continuous supporting portion 130 can more reliably support the its opposite sides to reliably avoid any unnecessary transverse flex deformation of the compressed elastic conductor 52 and also to positively perform the temporal hold of the elastic conductor 52.

Figure 18:
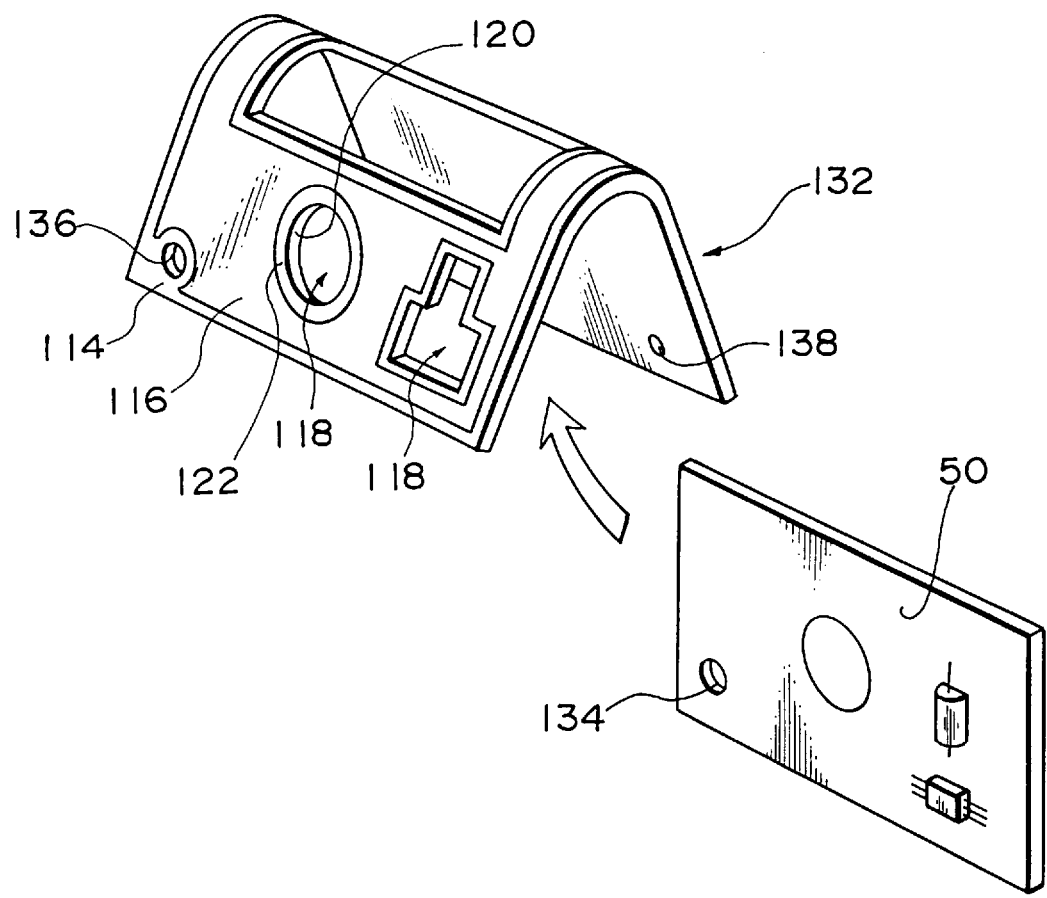
FIG. 18 is a perspective view showing the position of a shield plate according to a further embodiment of the present invention.
Figure 19:
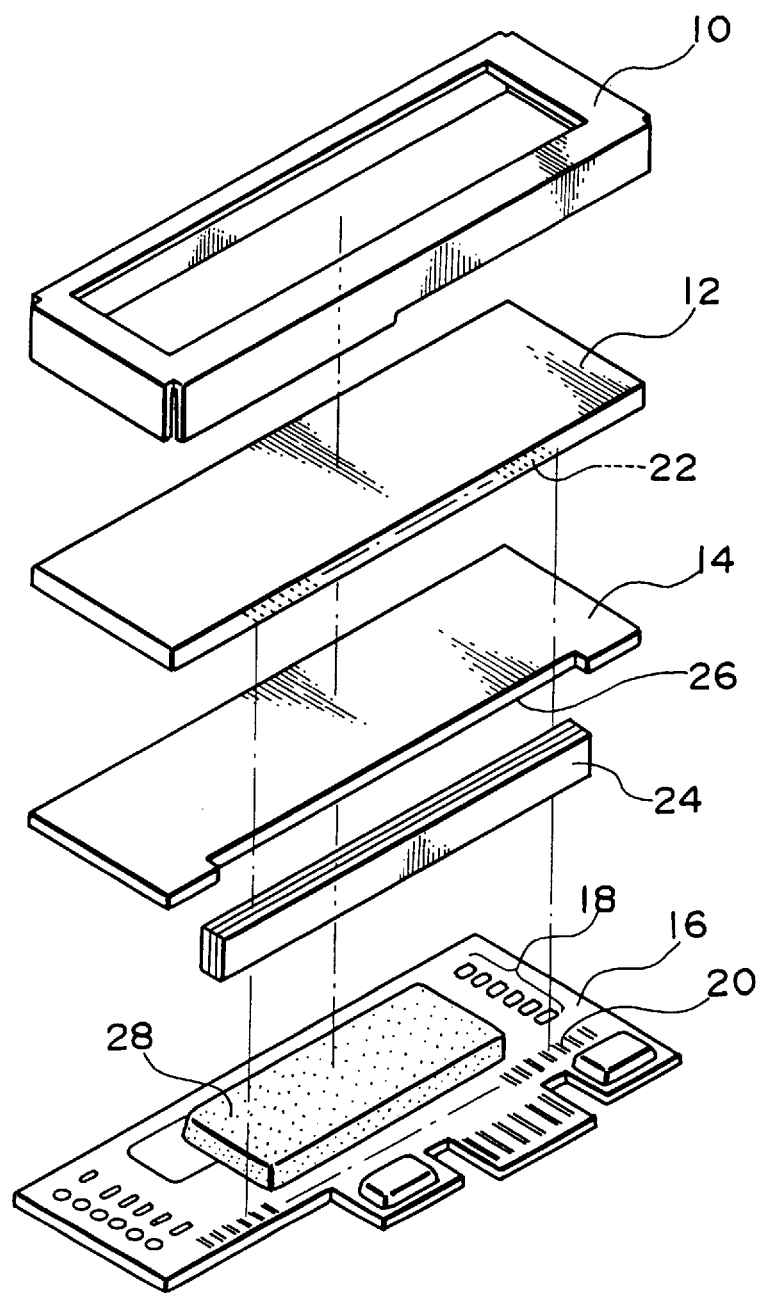
FIG. 19 is an exploded perspective view of a liquid crystal display device according to the prior art.

FIG. 18 shows a further embodiment of the present invention.

This embodiment uses a single shield plate 132 enclosing the top and bottom faces of a circuit board 50 to prevent a creation of noise, in place of the first and second shield plates 54, 56 in the previous embodiments. In FIG. 18, the backward and forward portions of the shield plate 132 correspond to the first and second shield plates 54, 56, respectively. The shield plate 132 is located to extend to the bottom of the circuit board 50 through a space formed between the positioning portions of the light guide plate 48 which are formed at its opposite ends to position the elastic conductors 52. Thus, the shield plate 132 can be more easily mounted in the liquid crystal display device without connection between the opposite ends of the shield plate on the top and bottom face of the circuit board.

The shield plate 132 is also formed of FPC and further shaped to have an insertion hole 118 which comprises a first insertion hole section 120 formed through the shield layer 116 and a second insertion hole 122 formed through the insulation layer 114 and smaller than the first insertion hole 120. This can prevent any short-circuiting in the electronic parts.

The circuit board 50 further includes a positioning hole 134 while the shield plate 132 also includes a positioning hole 136 formed therethrough at a position opposite to the positioning hole 134. A guide pin (jig) will be extended through and engaged in the positioning holes 134 and 136 to facilitate the positioning.

The bottom of the shield plate 132 further includes an insulation adhesive material 138 applied thereto for facilitating the mounting of the shield plate 132 on the circuit board.

The present invention is not limited to the aforementioned embodiments, but may be applied in any of various modified forms within the scope of the invention.

For example, the first shield plate 54 shown in FIGS. 1 to 13 may be formed of any suitable material other than FPC, such as copper foil or the like.

Although the embodiments have been described as to application to the display module in the pager, the present invention may be similarly to applied to any other suitable display module as camera display module or the like.

The present invention is not limited to the cases when the end portion of the light guide plate including the lamp is covered with the reflecting sheet to improve the efficiency in lamp illumination and when the elastic conductor is disposed in the corresponding positioning portion. For example, the reflecting sheet may be replaced by a reflecting paint material which is applied to the end of the light guide plate in which the lamp is included or applied, on one side, to the elastic conductor located within the corresponding positioning portion. Furthermore, all the edge face of the light guide plate may be covered with the reflecting sheet or the other reflective paint material.

What is claimed is:

1. A liquid crystal display device comprising:
a circuit board having an electrically conductive pattern;
a liquid crystal display panel including a central display area and a plurality of electrode terminals disposed along a plurality of sides and connected to said conductive pattern, said liquid crystal display panel being disposed opposite to said circuit board;

at least one elastic conductor disposed and compressed between said circuit board and said liquid crystal display panel for connecting part of said electrode terminals disposed along at least one side of said plurality of sides in said liquid crystal display panel to said conductive pattern of said circuit board;

a lamp for radiating a light toward said liquid crystal display panel; and a light guide plate disposed between said circuit board and said liquid crystal display panel for conducting the light from said lamp to said central display area of said liquid crystal display panel, said light guide plate having at least one positioning portion for positioning said elastic conductor such that at least three sides of said at least one elastic conductor are surrounded by said positioning portion, said positioning portion having a height equal to or lower than that of said compressed elastic conductor, said lamp being disposed at a position between said elastic conductor and said central display area.

2. A liquid crystal display device as defined in claim 1 wherein said light guide plate includes a portion receiving said lamp.

3. A liquid crystal display device as defined in claim 1 wherein said plurality of electrode terminals are disposed on said liquid crystal display panel along the opposite sides thereof and connected to the electrically conductive pattern of said circuit board through two of said elastic conductors and wherein two positioning portions for positioning said two elastic conductors are formed in said light guide plate on the opposite sides thereof.

4. A liquid crystal display device as defined in claim 3 wherein said light guide plate includes a thin-walled portion formed at an area opposite to the central display area of said liquid crystal display panel and two thick-walled portions extending toward said circuit board and formed at a position incorporating the two positioning portions and having its thickness larger than that of said thin-walled portion.

5. A liquid crystal display device as defined in claim 4 wherein one of said thick-walled portions is formed with a recess for receiving said lamp.

6. A liquid crystal display device as defined in claim 5 wherein said recess has an opening faced to the liquid crystal display panel and a bottom opposite to said opening and wherein a terminal insertion aperture for receiving the terminals of the lamp is formed through the bottom of the recess.

7. A liquid crystal display device as defined in claim 1 wherein a first reflector for reflecting the light from the lamp is further provided between the circuit board and the light guide plate and wherein a supporting portion for supporting the first reflector is formed on the surface of said light guide plate opposite to said circuit board.

8. A liquid crystal display device as defined in claim 1 wherein a second reflector for reflecting the light from said lamp is further provided at least between said lamp and said at least one elastic conductor.

9. A liquid crystal display device as defined in claim 8 wherein said second reflector is formed of a reflective material which is applied to the side of said at least one elastic conductor opposite to said lamp.

10. A liquid crystal display device as defined in claim 8 wherein said second reflector is in the form of a reflecting sheet applied to the side of said at least one elastic conductor opposite to said lamp.

11. A liquid crystal display device as defined in claim 3 wherein said liquid crystal display panel includes a plurality of scan electrode terminals disposed on said liquid crystal display panel along first and second opposing sides thereof and a plurality of signal electrode terminals disposed on said liquid crystal display panel along a third side between the first and second sides and wherein said plurality of scan electrode terminals disposed on said liquid crystal display panel along the first and second sides thereof are connected to the conductive pattern on said circuit board through the two elastic conductors.

12. A liquid crystal display device as defined in claim 11, further comprising a flexible circuit board for connecting said plurality of signal electrode terminals in said liquid crystal display panel to the conductive pattern of said circuit board.

13. A liquid crystal display device as defined in claim 12 wherein the flexible circuit board simultaneously supplies the same signal to two of said signal electrode terminals which are disposed at positions axisymmetrical with each other about a center line bisecting said plurality of signal electrode terminals.

14. A liquid crystal display device comprising:

a circuit board having an electrically conductive pattern;

a substantially rectangular liquid crystal display panel having a pair of shorter sides and a pair of longer sides, said liquid crystal display panel including a central display area, a plurality of single electrode terminals disposed along at least one of said pair of longer sides and a plurality of scan electrode terminals disposed along said pair of shorter sides and connected to said electrically conductive pattern, said liquid crystal display panel being disposed opposite to said circuit board, and comprising a flexible circuit board for connecting said plurality of signal electrode terminals to the conductive pattern of said circuit board, wherein the flexible circuit board simultaneously supplies the same signal to two of said signal electrode terminals which are disposed at positions axisymmetrical with each other about a center line bisecting said plurality of signal electrode terminals;

two elastic conductors disposed and compressed between said circuit board and said liquid crystal display panel for connecting said plurality of electrode terminals disposed along at least two sides of said liquid crystal display panel to said electrically conductive pattern of said circuit board;

a lamp for radiating a light toward said liquid crystal display panel; and a light guide plate disposed between said circuit board and said liquid crystal display panel for conducting the light from said lamp toward said liquid crystal display panel, said lamp being disposed between at least one of said elastic conductors and said display area, said light guide plate including a reflecting sheet on a top face, an outer periphery face and a bottom face of the light guide plate for avoiding any external leakage of the light from the lamp.

15. The liquid crystal display device as defined in claim 14, further comprising a first shield plate positioned between the light guide plate and the circuit board.

16. The liquid crystal display device as defined in claim 15, further comprising a second shield plate mounted on a bottom surface of the circuit board.

* * * * *